United States Patent [19]

Leon et al.

[11] Patent Number: 5,483,558
[45] Date of Patent: Jan. 9, 1996

[54] METHOD AND APPARATUS FOR DETECTING PHASE OR FREQUENCY LOCK

[75] Inventors: Ana S. Leon; Kin K. Chau-Lee, both of Austin, Tex.

[73] Assignee: Motorola Inc., Schaumburg, Ill.

[21] Appl. No.: 287,562

[22] Filed: Aug. 8, 1994

[51] Int. Cl.$^6$ .................................................. H03D 3/24
[52] U.S. Cl. .......................... 375/376; 375/373; 331/1 A; 331/DIG. 2
[58] Field of Search .................................. 375/119, 120; 331/1 A, DIG. 2; 327/156, 157, 160, 163; 328/63, 155

[56] References Cited

U.S. PATENT DOCUMENTS 5,036,216  7/1991  Hohmann et al. ...................... 331/1 A
5,166,644  11/1992  Saito et al. ............................. 331/1 A Primary Examiner—Stephen Chin
Assistant Examiner—Huong Luu

[57] ABSTRACT

A lock detection circuit (112) includes a first sampler (113) which samples an input signal (102) at a rate of an output signal (109) to provide a sampled input signal. A second sampler (114) which samples a feedback signal (111) at the rate of the output signal (109) to provide a sampled feedback signal. The sampled input signal is subsequently sampled by a third sampler (115) at the rate of the feedback signal. The sampled feedback signal is subsequently sampled by a fourth sampler (116) at the rate of the input signal. The second sampled input signal and the second sampled feedback signal are subsequently compared (117) and when they substantially match, an indication (122) is set to indicate that phase and/or frequency lock has been obtained.

16 Claims, 4 Drawing Sheets

METHOD AND APPARATUS FOR DETECTING PHASE OR FREQUENCY LOCK

TECHNICAL FIELD OF THE INVENTION

This invention relates generally to phase lock loop circuits and, in particular to, a method and apparatus for detecting phase and/or frequency lock within such circuits.

BACKGROUND OF INVENTION

As is known, phase lock loops (PLLs) at least include an input reference signal, a phase comparator, an Resistive-Capacitive low pass filter, a voltage controlled oscillator (VCO), and a divider. Such PLLs produce an accurate and stable clock reference and are used in a variety of electronic circuits such as microprocessors, digital signal processors (DSPs), radio receivers, and/or radio transmitters.

A PLL produces a stable clock reference by multiplying an input reference signal, which is generated by an oscillator, to produce a desired output signal. The multiplication factor is chosen based on the frequency of the oscillator and the desired output signal. For example, if the oscillator produces a 1.2 MHz reference signal and a desired output signal has a frequency of 60 MHz, the multiplication factor is 50. The desired output signal is locked in phase and/or frequency to the input reference signal via the divider, which divides the output signal by the multiplication factor to produce a feedback signal. The feedback signal and the input reference signal are inputted to the phase comparator, which produces a pump up signal or a pump down signal. The pump up or down signal is converted by the charge pump into a current, which charges, or discharges, the capacitor. The voltage imposed on the capacitor, via the charge pump, provides the input to the VCO, which, in turn, produces the desired output signal locked in phase and/or frequency to the input reference signal.

When a PLL is in a transition phase due to initial power up or an operational change, such as a change in the multiplication factor, the output signal is inaccurate and unstable. To prevent a circuit, which incorporates the PLL, from using the output signal during the transition period, a lock indicator or lock bit is provided. The lock bit is inactivated, or low, when the PLL is in the transition period and activated, or high, when the PLL has reached an acceptable steady state condition. Acceptable steady state conditions vary depending on the circuits operating requirements, but are generally less than 10% of the desired output signal frequency.

Currently, there are several lock detection techniques. For example, one technique requires the PLL to be under damped, i.e., a damping factor less than one. With an under damped PLL, the lock detection circuit counts a predetermined number of consecutive pump-up and pump-down signals into the charge pump. By counting consecutive pump-up and down signals, it is assumed that the VCO input voltage has reached a steady state condition. While this technique provides acceptable lock indications for circuits that have a moderate range of multiplication factors, i.e., less than 256, this technique is not acceptable when the range of multiplication factors is substantially increased, i.e., to a range greater than 4000. This technique is unacceptable because of the underdamping requirement, which, for large multiplication factors, causes the damping factor to approach zero. As the damping factor approaches zero, the transition period, i.e., the time it takes the PLL to reach a steady state condition, is increased beyond acceptable level, i.e., over 100 mSec.

Another lock detector technique utilizes only the frequency of the input reference clock and the feedback divider signal. This technique involves counting a predetermined number of cycles for each signal and then comparing the signals. Having done a first count and comparison, a second count and comparison is performed. If, after both counts and comparisons, the signals match, the lock detector is activated. If the signals do not match, the lock detector is inactivated. While this technique works well in many applications, it requires a substantial amount of hardware to implement and is limited to the accuracy of the input clock.

Therefore, a need exists for a method and apparatus that overcomes the above mentioned difficulties of prior art lock detection techniques.

DETAILED DESCRIPTION OF A PREFERRED EMBODIMENT

Generally, the present invention provides a method and apparatus for accurately detecting phase and/or frequency lock. This is generally accomplished when an input signal is received and multiplied to produce an output signal. A feedback signal is generated from the output signal and is sampled, along with the input signal, at the rate of the output signal. The sampled input signal is again sampled but this time at the rate of the feedback signal, likewise, the sampled feedback signal is again sampled but at the rate of the input signal. The second sampled feedback signal and the second sampled input signal are compared and when the signals substantially match, frequency or phase lock is indicated. With such a method and apparatus, drawbacks of prior art lock detection techniques are overcome, in that, the present invention substantially reduces hardware requirements, is not required to be an underdamped system, and improves overall accuracy by utilizing the output signal frequency as opposed to the input signal frequency.

Figure 1:
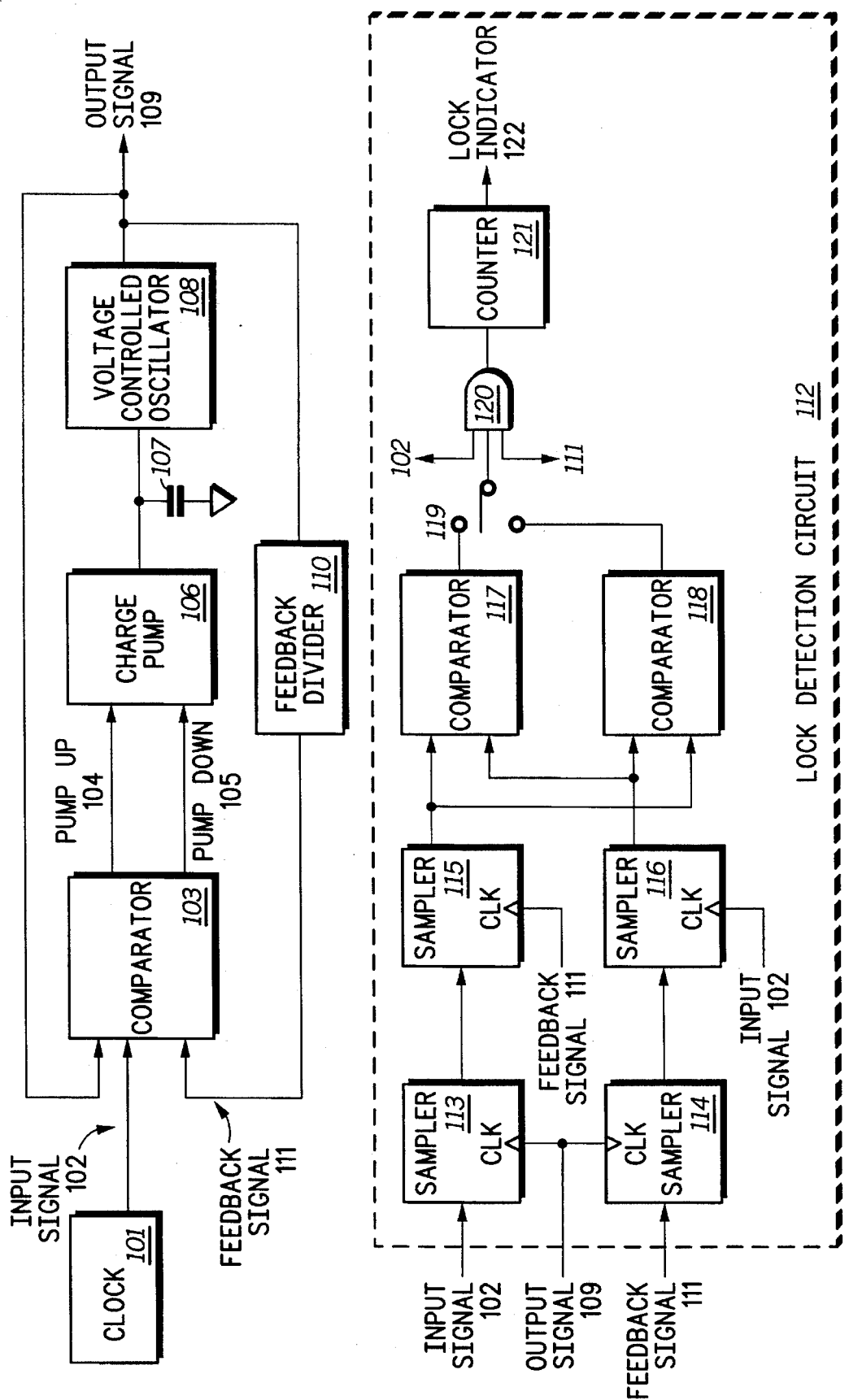
FIG. 1 illustrates a diagram of a phase lock loop which incorporates the present invention.

The present invention can be more fully described with reference to FIGS. 1–4. FIG. 1 illustrates a phase lock loop (PLL) 100 which includes a clock 101, a comparator 103, a charge pump 106, capacitor 107, a voltage control oscillator (VCO) 108, a feedback divider 110, and a lock detection circuit 112. The clock 101 produces an input signal 102, which may be a clock reference signal having a frequency from 32 kilohertz to 60 megahertz. The comparator 103 compares the input signal 102 with a feedback signal 111 to produce a control signal which may be a pump-up signal 104 or a pump-down signal 105. The comparator 103 produces the pump up 104 signal when the frequency of the input signal 102 is greater than the frequency of the feedback signal 111. Conversely, when the frequency of the input signal 102 is less than the frequency of the feedback signal 111, the comparator 103 produces the pump down 105 signal.

The control signals, i.e. the pump-up signal 104, or the pump-down signal 105, are provided to the charge pump 106 which generates a current that, in turn, charges or discharges the capacitor 107. The charging or discharging the capacitor 107 produces a voltage which is inputted to the VCO 108. The VCO 108 then converts the inputted voltage to the output signal 109. The output signal 109 is divided by the feedback divider 110 to produce the feedback signal 111. The division factor of the feedback divider 110 is equivalent to the multiplication factor of the PLL.

The lock detection circuit 112 includes four samplers 113–116 two comparators 117–118, a switching element 119, an AND gate 120, and a counter 121. The samplers 113–116 may be any type of flip flop which provides a lock output, for example, the samplers may be master slave D flip-flops or sychronizers such that metastability is substantially eliminated. The comparators 117–118 may be any type of comparator that produces an active signal (for example a logic "1") when both inputs match. For example the comparators may be NAND-gates, AND-gates or a combination thereof. The counter 121 may be any type of binary counter and count to any predetermined number. For example, the counter 121 may be a plurality of D flip-flops which provide a binary count, while the predetermined number two to several hundred counts, depending on the accuracy of the desired lock indication.

The lock detection circuit 112 provides the lock indicator 122 by receiving the input signal 102, the output signal 109, and the feedback signal 111. The first sampler 113 samples the input signal 102 at the rate of the output signal 109; likewise, the second sampler 114 samples the feedback signal 111 at the rate of the output signal 109 to produce a sampled input signal and a sampled feedback signal, respectively. The third sampler 115 samples the sampled input signal at a rate of the feedback signal 111 to produce a second sampled input signal; while the fourth sampler 116 samples the sampled feedback signal at a rate of the input signal 102 to produce a second sampled feedback signal. The second sampled input signal and the second sampled feedback signal are then compared by comparators 117 and 118.

The first comparator 117 is coupled to the AND gate 120, via the switch, or switching element, 119, when the lock detection circuit 112 is determining whenlock has been obtained in the PLL 100. When in this position, the comparator 117 is looking for matches between the second sampled input signal and the feedback signal. When these signals match, the output of the comparator 117 will remain high providing a comparison result, thus allowing the counter 121 to be triggered via the input signal 102 and the output signal 109. Once the counter 121 has reached a predetermined number count, the lock indicator 122 is set. If, however, the output of comparator 117 falls low before the counter 121 reaches the predetermined number, the counter 121 is reset.

After the lock indicator 122 is set, the switch 119 is triggered to couple the second comparator 118 to the AND-gate 120, thus converting the lock detection circuit 112 to an unlock detector. In this instance, the comparator 118 is comparing the second sampled input signal and feedback signal produced by the third and fourth samplers 115 and 116 for nonmatches. When nonmatches occur, the output of comparator 118 remains high, thus enabling the counter 121. Once the counter 121 reaches a predetermined number, the lock indicator 122 is inactivated indicating that lock is lost. If, however, the output of comparator 118 falls low before the counter 121 reaches the predetermined count, the counter 121 is reset.

Figure 2:
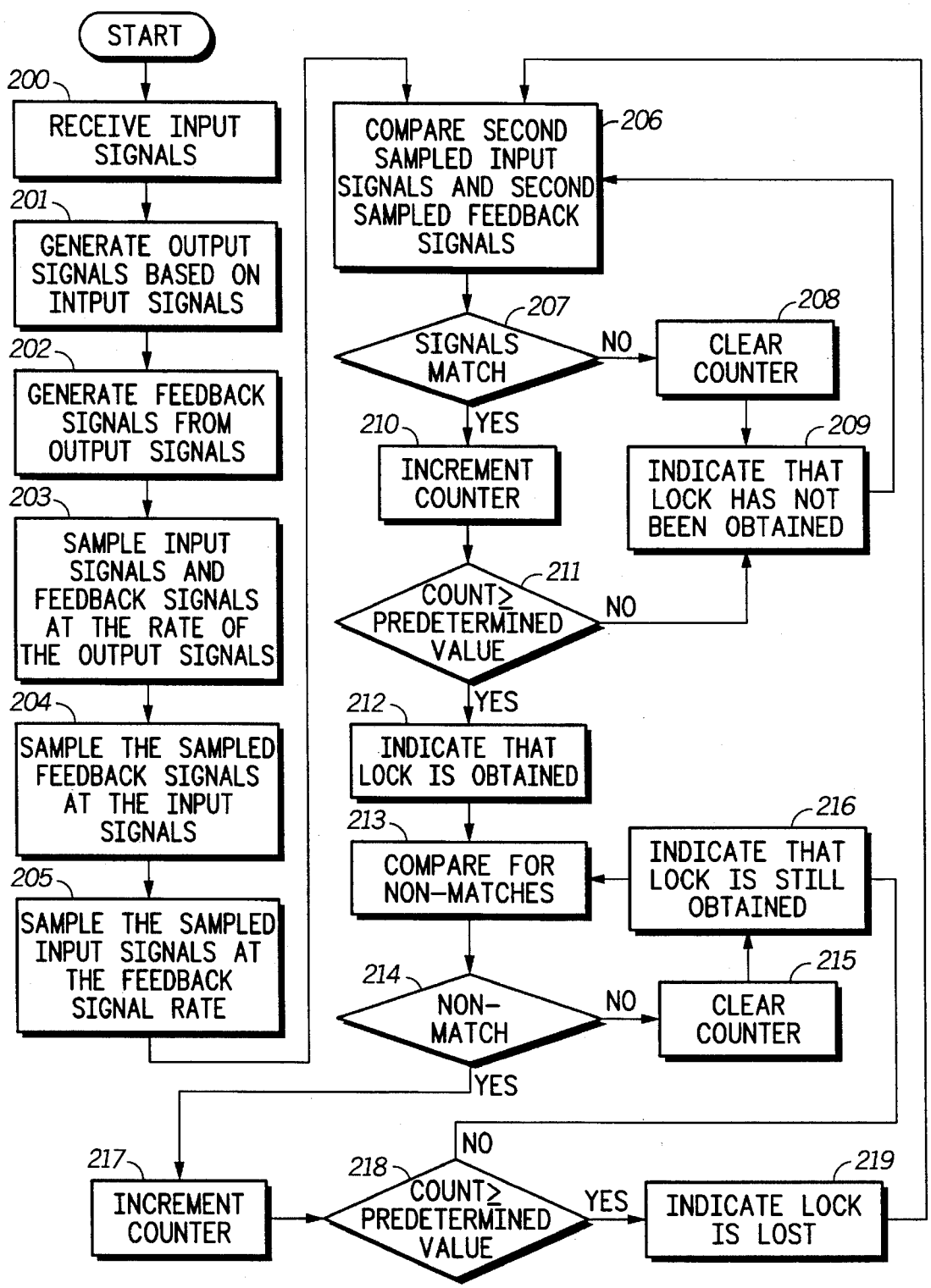
FIG. 2 illustrates a logic diagram that may be used to implement the present invention.

FIG. 2 illustrates a logic diagram which may be used 40 implement the present invention. At step 200 an input signal is received. As mentioned above, this input signal is generated by the clock 101 and may be in the range of 32 kilohertz to 60 megahertz. From the input signal, an output signal is generated 201, wherein the output signal is some multiple of the input signal. The multiplication factor used to generate the output signal is dependent on the needs of the user for the PLL. For example, if the PLL is utilized in a DSP, the multiplication factor may be anywhere from 1 to 4,096, wherein the multiplication factor is dependent on the operations being executed by the DSP. Having generated an output signal 201, a feedback signal is generated therefrom 202.

The feedback signal and the input signal are then sampled at the rate of the output signal to produce sampled input signals and sampled feedback signals 203. By utilizing the output signal as the sampling rate, the accuracy of lock indication is dramatically improved over the prior art. This occurs because the accuracy of the present invention is dependent on 1/N of the output frequency, wherein N is the multiplication factor. Thus, as N increases, the number of sample points increases, which corresponds to increased accuracy.

Having sampled the input and feedback signals at the rate of the output signal, the sampled feedback signal is again sampled but this time at the rate of the input signal 204. Likewise, the sampled input signal is again sampled but this time at the rate of the feedback signal 205. This sampling step is performed to determine the phase relationship between the feedback signal and the input signal. In addition, sampling the signals in this manner prevents a false indication which occurs when the feedback signal is a multiple of the input signal.

The second sampled input signals and the second sampled feedback signals are then compared 206. If a match does not occur 207, the counter is cleared 208, and an indication is provided that lock has not yet been obtained 209. Having done this, the next cycle of the input signal and feedback signal sampled and compared as described above in steps 200–207.

Once a match is obtained 207, the counter is incremented 210. Having incremented the counter 210, a determination is made as to whether the count has reached a predetermined value 211. When the predetermined value has not been reached, the process continues at step 209 for subsequent cycles of the input and feedback signals. When the count reaches or exceeds the predetermined value 211, a lock indication is set 212, wherein lock indication may be established by setting a bit.

Having set the lock bit, the process continues at step 213 by comparing for nonmatches. (As mentioned above, after the lock indication is activated, switch 119 is switched from comparator 117 to 118.) When the second sampled signals continue to match 214, the counter is cleared 215 and an indication continues to be set indicating that lock is obtained 216. When a nonmatch occurs 214, the counter is incremented 217 and compared with a predetermined value 218. When the count has not reached the predetermined value 218, the lock bit indicator remains active 216 and the process continues 213. When the count has reached the predetermined value 218, the lock bit is inactivated indicating that lock is lost 219. Having indicated that the lock is lost, the process reverts back to 206.

Figure 3:
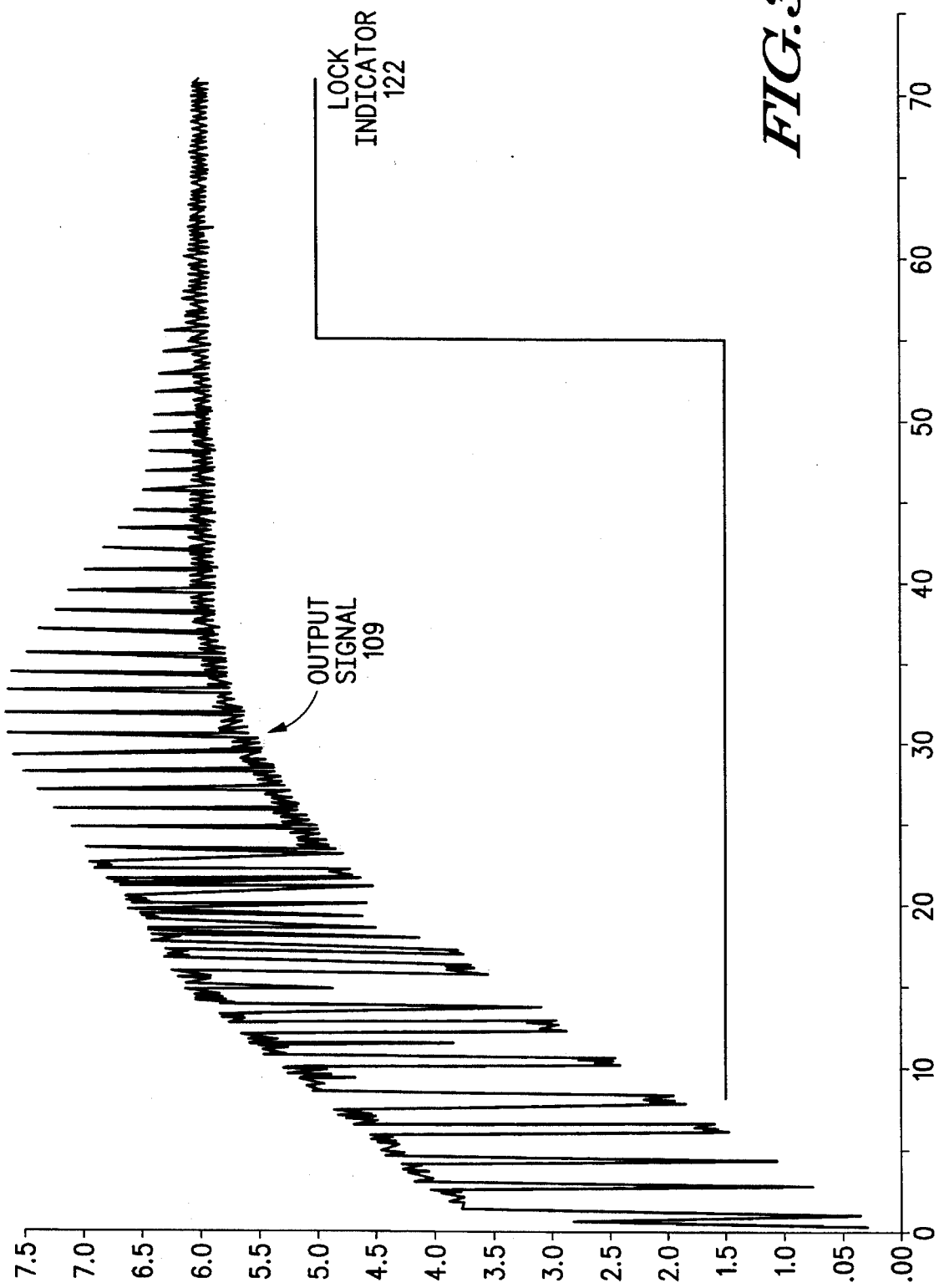
FIG. 3 illustrates the output signal and lock bit indicator of the PLL of FIG. 1.

FIG. 3 illustrates the output signal 109 and the lock indicator 122 over a period of time, wherein the x-axis is delineated in μSec and the y-axis is 10X MHz. As shown, the output signal 109 is in transition from 0 Hz to approximately 60 MHz for about 55 μSec. Once the output signal 109 obtains a relatively steady state condition i.e., within 10% of the desired output frequency, the lock indicator 122 is activated high. The steady state condition may vary depending on user requirements, but typically, the steady state condition is obtained when the output signal 109 is within 10% of its desired level.

Figure 4:
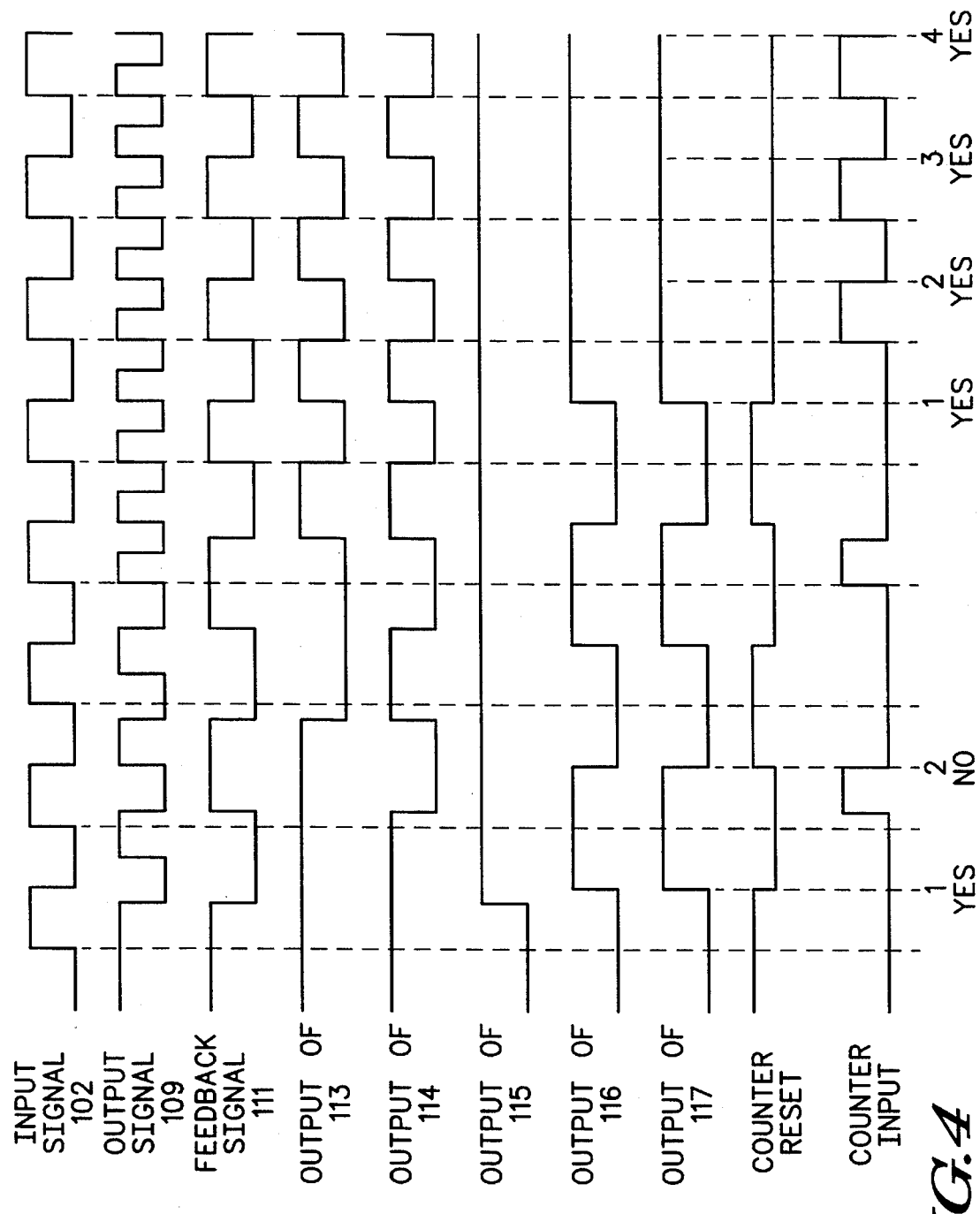
FIG. 4 illustrates a timing diagram of the circuit shown in FIG. 1.

FIG. 4 illustrates a timing diagram of the present invention. As shown, the input signal 102 is utilized to generate the output signal 109. In this example, the desired output frequency is twice the input frequency. To achieve the desired output frequency, the feedback signal 111 is generated by dividing the output frequency 109 by the multiplication factor, in this example: 2. The input signal 102 and the feedback signal 111 are sampled at the rate of the output signal 109, which is illustrated by the output of 113 and the output of 114, respectively. The output of 113, or the sampled input signal, is again sampled, but this time at the rate of the feedback signal, which is depicted as the output of 115, or the second sampled input signal. Similarly, the output of 114, or the sampled feedback signal, is again sampled, but this time at the rate of the input signal, which is depicted as the output of 116, or the second sampled feedback signal. The outputs of 115 and 116 are then compared by the comparator 117 to determine their phase and frequency relationship, which is shown as the output of 117. The output of 117 is ANDed with the input signal 102 and the feedback signal 111 to provide the counter input signal, which is shown as the Counter Input. An inverse of the output of 117 is used as a counter reset, which is shown as Counter Reset.

As shown, when a PLL is first enabled, or after a multiplication factor change, the output signal 109 is not at the desired multiplication factor of the input signal 102. In this example, the output is less than 2 times the input signal 102. For these first few cycles, the feedback signal 111, which is 2 times the output signal, does not match well with the input signal 102. As such, the comparison of these two signals yields a toggling output as illustrated by the output of 117. As mentioned above, the output of 117 is used to reset the counter. Thus, as the input signal 102 and the feedback signal 111 remain out of synchronization, the counter is continually reset, thus preventing a lock indicator 122 to be set.

As each cycle passes, the output signal 109 incrementally approaches its desired frequency until it is at the desired frequency, which is illustrated by the later cycles shown. As the output signal 109 approaches the desired frequency, the feedback signal 111 looks more and more like the input signal 102. Thus, when these signals are compared via the comparator 117 a substantial match is indicated, which is shown as the output of 117 remaining high. With the output 117 remaining high, the Counter Reset is held low, while the Counter Input is the input signal 102 ANDed with the feedback signal 111. Thus, the counter 121 is allowed to count up to the predetermined value, and once this value is reached, the lock indication 122 is set.

FIG. 4 also illustrates a false lock indication condition and how the present invention resolves this problem. As can be seen with the first cycle, the feedback signal 111 is almost half the frequency of the input signal 102. In this situation, the leading and trailing edges of the input signal occurs at leading and trailing edges of the feedback signal, albeit at twice the rate. If the second stage of sampling were not included, this situation would produce a lock indication because at each transition of the feedback signal, the input signal is in a transition. But, because the present invention includes the second stage of sampling, this situation is detected when the second sampled signals are compared by the comparator 117, which produces the toggling output as shown in the first few cycles. Thus, the second sampling stage prevents false lock indication due to the feedback signal and the input signal being multiples of one another.

The present invention provides a method and apparatus for detecting phase and/or frequency lock. With such a method and apparatus, the difficulties of prior art lock detection circuits have been overcome. In particular, the present invention does not have the underdamping requirement of some prior art techniques, nor does it have the extensive hardware requirements of other prior art techniques. In addition, the present invention increases the accuracy of lock bit detection over prior art technique by utilizing the output frequency, as opposed to input frequencies, as the sampling rate. In addition, the present invention may be implemented with all digital circuitry.

We claim:

1. A method for detecting at least phase lock or frequency lock, the method comprising the steps of:
   a) receiving an input signal;
   b) generating an output signal based on the input signal;
   c) generating a feedback signal from the output signal;
   d) sampling the input signal and the feedback signal at a rate of the output signal to produce a sampled input signal and a sampled feedback signal, respectively;
   e) sampling the sampled input signal at a rate of the feedback signal to produce a second sampled input signal;
   f) sampling the sampled feedback signal at a rate of the input signal to produce a second sampled feedback signal;
   g) comparing the second sampled feedback signal with the second sampled input signal; and
   h) when the second sampled feedback signal substantially matches the second sampled input signal, indicating that at least phase lock or frequency lock is obtained.

2. The method of claim 1, wherein step (h) further comprises:
   1) counting each consecutive occurrence of a substantial match between the second sampled feedback signal and the second sampled input signal to produce a count;
   2) comparing the count with a predetermined value; and
   3) when the count equals or exceeds the predetermined value, indicating that the at least phase lock or the frequency lock is obtained.

3. The method of claim 2 further comprises resetting the count when the second sampled feedback signal does not match the second sampled input signal prior to the count reaching the predetermined value.

4. The method of claim 2 further comprises counting the consecutive occurrences of a substantial match at a rate based on the input signal, the feedback signal, and a comparison result.

5. The method of claim 1 further comprises, after the phase lock or the frequency lock is obtained,
   i) comparing the second sampled feedback signal with the second sampled input signal for nonmatches; and P1 j) when a nonmatch is detected, indicating that the phase lock or the frequency lock is lost.

6. The method of claim 5, wherein step (j) further comprises:

1) counting each consecutive occurrence of a nonmatch between the second sampled feedback signal and the second sampled input signal to produce a count;

2) comparing the count with a predetermined value; and 3) when the count equals or exceeds the predetermined value, indicating that the phase lock or the frequency lock is lost.

7. A lock detection circuit comprising:

a first sampler that produces a sampled input signal by sampling an input signal at a rate of an output signal;

a second sampler that produces a sampled feedback signal by sampling a feedback signal at the rate of the output signal, wherein the feedback signal is derived from the output signal;

a third sampler that produces a second sampled input signal by sampling the sampled input signal at a rate of the feedback signal;

a fourth sampler that produces a second sampled feedback signal by sampling the sampled feedback signal at a rate of the input signal; and a comparator that compares the second sampled feedback signal to the second sampled input signal, wherein the comparator produces a lock indication when the second sampled feedback signal substantially matches the second sampled input signal.

8. The lock detection circuit of claim 7 further comprises a counter operably coupled to the comparator, wherein the counter delays the lock indication until a predetermined number of consecutive matches have occurred.

9. The lock detection circuit of claim 7 further comprises a second comparator operably coupled to the third sampler and the fourth sampler, wherein the second comparator compares the second sampled feedback signal to the second sampled input signal and produces a lock lost indication when the second sampled feedback signal does not match the second sampled input signal.

10. A phase lock loop circuit comprising:

a clock that produces an input signal; a phase comparator that compares the input signal with a feedback signal to produce a comparison signal;

a charge pump that produces a control signal based on the comparison signal;

a voltage controlled oscillator that produces an output signal based on the control signal;

a feedback divider that produces the feedback signal from the output signal;

a lock detection circuit that includes:

a first sampler that produces a sampled input signal by sampling the input signal at a rate of the output signal;

a second sampler that produces a sampled feedback signal by sampling the feedback signal at the rate of the output signal, wherein the feedback signal is derived from the output signal;

a third sampler that produces a second sampled input signal by sampling the sampled input signal at a rate of the feedback signal;

a fourth sampler that produces a second sampled feedback signal by sampling the sampled feedback signal at a rate of the input signal; and a comparator that compares the second sampled feedback signal to the second sampled input signal, wherein the comparator produces a lock indication when the second sampled feedback signal substantially matches the second sampled input signal.

11. The phase lock loop circuit of claim 10, wherein the lock detection circuit further comprises a counter operably coupled to the comparator, wherein the counter delays the lock indication until a predetermined number of consecutive matches have occurred.

12. The phase lock loop circuit of claim 10, wherein the lock detection circuit further comprises a second comparator operably coupled to the third sampler and the fourth sampler, wherein the second comparator compares the second sampled feedback signal to the second sampled input signal and produces a lock lost indication when the second sampled feedback signal does not match the second sampled input signal.

13. A method for detecting when phase or frequency lock is lost, the method comprising the steps of:

a) receiving an input signal;

b) generating an output signal based on the input signal;

c) generating a feedback signal from the output signal;

d) sampling the input signal and the feedback signal at a rate of the output signal to produce a sampled input signal and a sampled feedback signal, respectively;

e) sampling the sampled input signal at a rate of the feedback signal to produce a second sampled input signal;

f) sampling the sampled feedback signal at a rate of the input signal to produce a second sampled feedback signal;

g) comparing the second sampled feedback signal with the second sampled input signal; and h) when the second sampled feedback signal does not match the second sampled input signal, indicating that phase or frequency lock is lost.

14. The method of claim 13, wherein step (h) further comprises:

1) counting each consecutive occurrence of a nonmatch between the second sampled feedback signal and the second sampled input signal to produce a count;

2) comparing the count with a predetermined value;

3) when the count equals or exceeds the predetermined value, indicating that the phase or frequency lock is lost.

15. The method of claim 14 further comprises resetting the count when the second sampled feedback signal matches the second sampled input signal prior to the count reaching the predetermined value.

16. The method of claim 14 further comprises counting the consecutive occurrences of a nonmatch at a rate based on the input signal, the feedback signal, and a comparison result.

* * * * *

UNITED STATES PATENT AND TRADEMARK OFFICE
CERTIFICATE OF CORRECTION

PATENT NO. : 5,483,558
DATED : January 9, 1996
INVENTOR(S) : Ana Sonia Leon, et al.

It is certified that error appears in the above-indentified patent and that said Letters Patent is hereby corrected as shown below:

In claim 5, Col. 6, Line 65; after "and", delete "P1".

In claim 14, Col. 8, Line 49; after "value;", add --and--.

Signed and Sealed this

Twenty-seventh Day of August, 1996

Attest:

BRUCE LEHMAN

Attesting Officer     Commissioner of Patents and Trademarks